(12) United States Patent
Döllgast et al.

(10) Patent No.: US 7,928,636 B2
(45) Date of Patent: Apr. 19, 2011

(54) RECEIVING SLEEVE FOR AN ACTUATOR BODY

(75) Inventors: Bernd Döllgast, Erlangen (DE);
Emanuel Sanftleben, Pfatter (DE);
Marcus Unruh, Zeitlam (DE)

(73) Assignee: Continental Automotive GmbH, Hannover (DE)

( * ) Notice: Subject to any disclaimer, the term of this patent is extended or adjusted under 35 U.S.C. 154(b) by 783 days.

(21) Appl. No.: 10/595,392

(22) PCT Filed: Oct. 11, 2004

(86) PCT No.: PCT/EP2004/052500
§ 371 (c)(1),
(2), (4) Date: Nov. 19, 2007

(87) PCT Pub. No.: WO2005/035972
PCT Pub. Date: Apr. 21, 2005

(65) Prior Publication Data
US 2008/0315726 A1 Dec. 25, 2008

(30) Foreign Application Priority Data

Oct. 14, 2003 (DE) .................. 103 47 774

(51) Int. Cl.
*H01L 41/08* (2006.01)
(52) U.S. Cl. ....................................................... 310/355
(58) Field of Classification Search .................. 310/328, 310/311, 355; 123/472; 239/533.2; *H01L 41/08*
See application file for complete search history.

(56) References Cited

U.S. PATENT DOCUMENTS

| | | | |
|---|---|---|---|
| 6,057,633 A | 5/2000 | Inoi et al. ...................... 310/345 |
| 6,274,967 B1 | 8/2001 | Zumstrull et al. ............ 310/328 |
| 6,333,586 B1 * | 12/2001 | Polach et al. ................. 310/328 |
| 6,684,861 B2 | 2/2004 | Reiter ........................... 123/470 |
| 6,874,475 B2 * | 4/2005 | Katsura et al. ................ 123/467 |
| 6,919,666 B2 | 7/2005 | Bartzke et al. ............ 310/323.01 |
| 6,930,438 B2 * | 8/2005 | Cramer et al. ................ 310/328 |
| 2002/0039060 A1 | 4/2002 | Maruyama ..................... 335/220 |

FOREIGN PATENT DOCUMENTS

| | | |
|---|---|---|
| DE | 19653555 | 6/1998 |
| DE | 19818036 | 11/1999 |
| DE | 19826339 | 12/1999 |
| DE | 19847996 | 4/2000 |
| DE | 10012751 | 9/2001 |
| DE | 10026635 | 1/2002 |
| DE | 10108467 | 9/2002 |
| DE | 10225408 | 12/2003 |

OTHER PUBLICATIONS

PCT Search Report with Written Opinion, PCT/EP2004/052500, 20 pgs., Jan. 14, 2005.

* cited by examiner

*Primary Examiner* — Thomas M. Dougherty
*Assistant Examiner* — Karen B Addison
(74) *Attorney, Agent, or Firm* — King & Spalding L.L.P.

(57) ABSTRACT

A receiving sleeve (1) for an actuator body, in particular for holding a piezoelectric stack of a piezoelectric actuator, is used to drive an injector of an injection system for an internal combustion engine. The sleeve is equipped with at least one spring element (10, 11) for centering the actuator body in the receiving sleeve (1) and/or for compensating component tolerances of the actuator body.

18 Claims, 4 Drawing Sheets

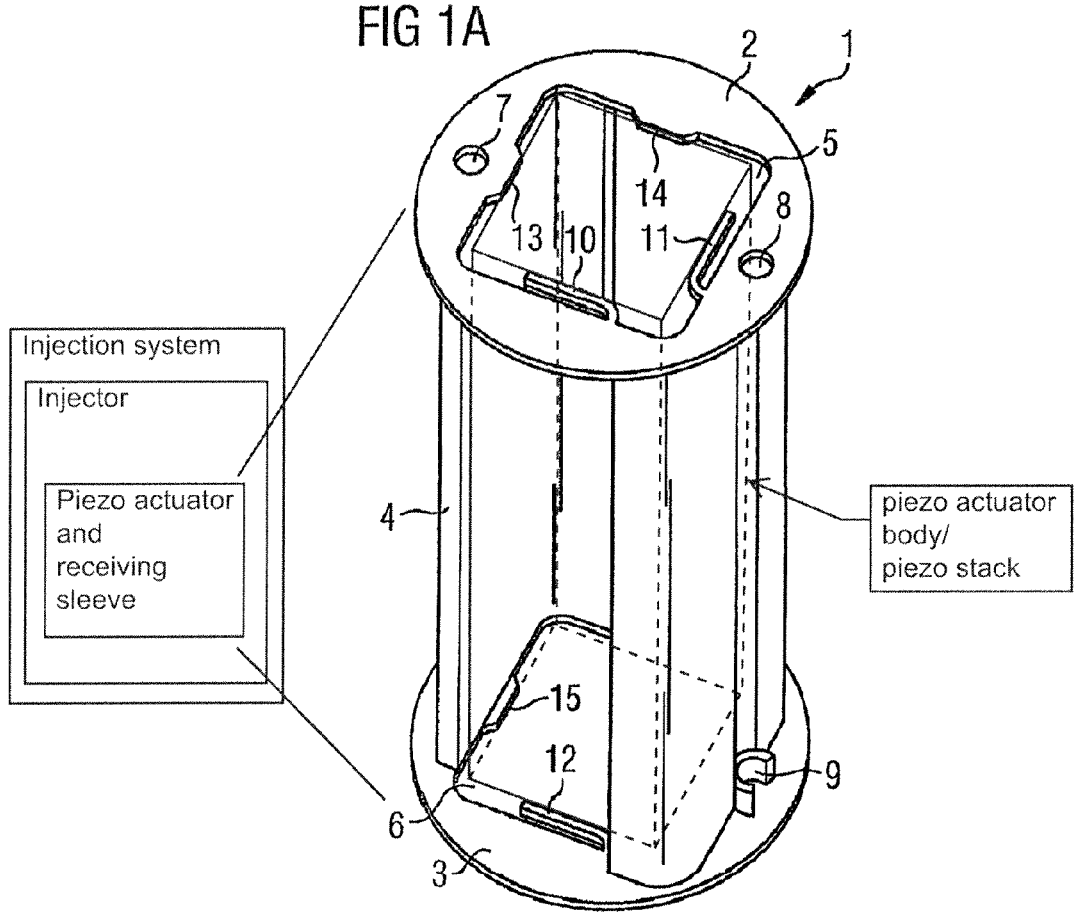
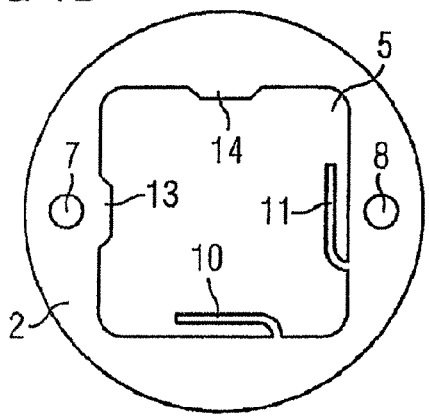

US 7,928,636 B2

RECEIVING SLEEVE FOR AN ACTUATOR BODY

CROSS-REFERENCE TO RELATED APPLICATIONS

This application is a U.S. national stage application of International Application No. PCT/EP2004/052500 filed Oct. 11, 2004, which designates the United States of America, and claims priority to German application number DE 103 47 774.8 filed Oct. 14, 2003, the contents of which are hereby incorporated by reference in their entirety.

TECHNICAL FIELD

The invention relates to a receiving sleeve for an actuator body, in particular for accommodating a piezo stack of a piezo actuator designed for driving an injector of a fuel injection system for an internal combustion engine.

BACKGROUND

In the production of piezo actuators for injectors of fuel injection systems it is known to insert a piezo stack in a plastic receiving sleeve and, after electrical contacting of the piezo stack, to silicone-encapsulate it in said receiving sleeve, thereby immovably fixing the piezo stack and also the electrical terminal pins in the piezo actuator. For this purpose the known receiving sleeve has guide holes whose internal cross section is matched to the external cross section of the piezo stack so that the guide holes align the piezo stack when inserted.

The disadvantage of this known receiving sleeve for the production of a piezo actuator is the fact that the position of the piezo stack in the encapsulated piezo actuator sometimes deviates from the relevant specifications, which can result in problems when installing the piezo actuator.

SUMMARY

The object of the invention is therefore to improve the known piezo actuator receiving sleeve described above in such a way that the positioning of the piezo stack in the receiving sleeve precisely meets the relevant specifications.

This object is achieved by a receiving sleeve for an actuator body, particularly for accommodating a piezo stack of a piezo actuator designed to drive an injector of an injection system for an internal combustion engine, comprising at least one spring element for centering the actuator body in the receiving sleeve and/or for compensating component tolerances of the actuator body.

The invention proceeds from the technical recognition that the mis-positioning of the piezo stack in the ready-encapsulated piezo actuator is caused by component tolerances of the piezo stack and of the associated guide holes in the receiving sleeve. For example, the internal cross section of the guide holes of the receiving sleeve must be made large enough to still allow the piezo stack to be inserted in the guide holes of the receiving sleeve even in the case of adverse out-of-tolerances. However, this dimensioning of the guide holes of the receiving sleeve mostly results in a loose fit between the piezo stack and the receiving sleeve, associated with correspondingly imprecise positioning of the piezo stack inside the receiving sleeve.

The invention additionally proceeds from the technical recognition that the positioning errors also consist in mis-centerings of the piezo stack inside the receiving sleeve.

The invention therefore provides for at least one spring element for centering the actuator body in the receiving sleeve and/or compensating component tolerances of the actuator body or of the receiving sleeve. The spring element provided according to the invention can therefore fulfill two different functions, namely centering the actuator body inside the receiving sleeve and also compensating component tolerances. However, it is not necessary within the scope of the invention for the receiving sleeve according to the invention to fulfill both functions. Rather it is also possible for the inventive receiving sleeve only to bring about compensation of component tolerances of the actuator body without centering the actuator body inside the receiving sleeve. Moreover, it is also possible for the spring element provided according to the invention to only bring about centering of the actuator body inside the receiving sleeve without compensating component tolerances of the actuator body or receiving sleeve.

In a preferred embodiment of the invention, at least one spring element is disposed on opposite sides of the actuator body, the opposite spring elements each pressing against the actuator body from outside in order to center the actuator body in the receiving sleeve, and the spring forces exerted by the individual spring elements on the actuator preferably being radially oriented with respect to the actuator's longitudinal axis. However, the oppositely disposed spring elements of the receiving sleeve according to the invention center the actuator body inside the receiving sleeve in one degree of freedom of movement only. For complete alignment of the actuator body in all laterally oriented degrees of freedom of movement, two further spring elements are therefore preferably provided which are disposed on opposite sides of the actuator body and press against the actuator body from outside in order to center the actuator body in the receiving sleeve in a second degree of freedom of movement also. To achieve complete lateral centering of the actuator body inside the receiving sleeve, the axes of force of the two pairs of spring elements are angled toward one another and preferably enclose an essentially right angle.

In another embodiment of the invention, in contrast, there is disposed on one side of the actuator body a spring element which presses against the actuator body from outside, whereas a rigid stop is located on the opposite side of the actuator body, the spring element therefore pressing the actuator body against the rigid stop so that the actuator body assumes a defined position, it being also preferably provided that the actuator body is precisely positioned in all possible lateral directions of movement. For this purpose there is preferably provided another spring element which presses against the actuator body from another side and presses it against another stop disposed on the opposite side, the two spring elements in conjunction with the two rigid stops therefore bringing about precise positioning of the actuator body inside the receiving sleeve in all lateral directions, and the axes of force of the two spring elements again being angled toward one another and preferably enclosing a right angle in order to position the actuator body as accurately as possible. In this embodiment of the invention, component tolerances of the actuator body and receiving sleeve are compensated, but the actuator body is not necessarily centered inside the receiving sleeve, as the position of the actuator body is predefined by the tolerance-sensitive rigid stops.

The receiving sleeve according to the invention preferably has two guide holes for supporting the actuator body, at least one spring element being disposed on the two guide holes in order to center the actuator body in the guide holes and/or compensate component tolerances. The two guide holes are preferably essentially square in order to be able to accommodate the normal piezo stacks of square cross section, a spring element being disposed on each lateral edge of the guide holes so that, at each guide hole, a total of at least four spring elements act on the actuator body and center it inside the guide holes.

Alternatively, however, it is also possible for each guide hole to have a spring element on two of its lateral edges and to have a stop on its two other lateral edges, the spring elements being opposite a stop in each case. In this embodiment the two spring elements press the actuator body against their respective rigid stops, so that the final position of the actuator body is predefined by the rigid stops.

In the above-described variant with rigid stops, the two spring elements are preferably disposed on the two guide holes on adjacent lateral edges in each case, whereas the two stops are disposed on the two guide holes on the other two adjacent lateral edges in each case, the two spring elements therefore having axes of force which are oriented at right angles to one another, resulting in precise positioning of the actuator body within the receiving sleeve.

The individual spring elements are preferably formed of a piece with the receiving sleeve which can be made e.g. of plastic.

In an embodiment of the spring elements also termed single-arm, the latter are elongated, with one of their ends being formed of a piece with the receiving sleeve while the other end is pressed freely and elastically against the actuator body.

Alternatively, however, it is also possible for the spring elements to be formed of a piece with the receiving sleeve at both ends, the central region of the spring elements being elastically pressed against the actuator body.

In addition, it should be mentioned that the contact between the individual spring elements and the actuator body is preferably punctiform or linear in order to reduce the friction between the actuator body and the spring elements during the longitudinal expansion and contraction of the actuator body occurring during operation. Such a punctiform or linear contact between the spring elements and the actuator body can be achieved e.g. by providing the spring elements with projecting lugs which constitute the punctiform or linear contact with the actuator body.

In addition, the spring elements can be beveled in order to facilitate the insertion of the actuator body in the receiving sleeve.

However, the invention encompasses not only the receiving sleeve implemented according to the invention as described above, but also a complete piezo actuator with a receiving sleeve according to the invention and an actuator body inserted in same.

The invention also includes an injector for a fuel injection system of an internal combustion engine with a piezo actuator of this kind as well as a complete injection system having an injector of this kind.

BRIEF DESCRIPTION OF THE DRAWINGS

Other advantageous further developments of the invention will now be explained in greater detail together with the description of the preferred embodiments of the invention with reference to the accompanying drawings in which:

FIGS. 1a and 1b show a first embodiment of a receiving sleeve according to the invention for a piezo actuator.

DETAILED DESCRIPTION

Figure 2A:
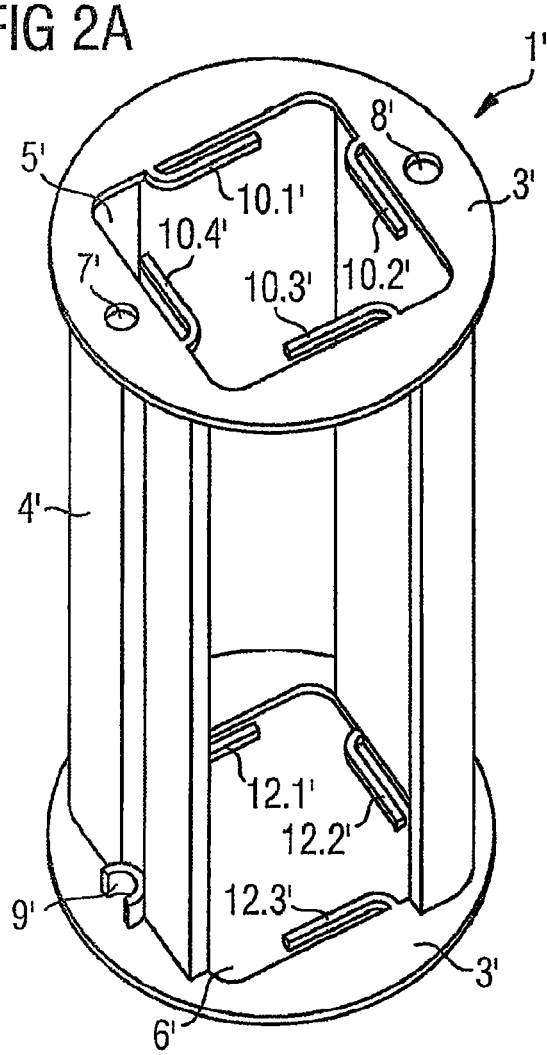
FIGS. 2a and 2b show an alternative embodiment of a receiving sleeve according to the invention.

FIGS. 1a and 1b show a plastic receiving sleeve 1 which is used in the production of a piezo actuator for an injector of an injection system for an internal combustion engine.

The receiving sleeve 1 has the task, on the one hand, of aligning a piezo stack inserted in the receiving sleeve 1 and two associated electrical terminals pins for electrical contacting, the contacting of the piezo stack being performed by wire winding.

On the other hand, in the production of a piezo actuator the receiving sleeve 1 has the task of aligning the piezo stack and the associated electrical terminals pins during encapsulation with silicone until the potting compound has cured and the piezo stack and the associated electrical terminal pins are immovably fixed.

To perform these two tasks the receiving sleeve is made cage-shaped and has two end plates 2, 3 which are interconnected by axially running ribs 4, essentially square guide holes 5, 6 being disposed in the end plates 2, 3. During manufacturing of a piezo actuator, a piezo stack with a likewise essentially square cross section is inserted in the guide holes 5, 6 of the two end plates 2, 3, the piezo stack projecting axially somewhat beyond the end plates 2, 3 so that the piezo stack is guided laterally in the guide holes 5, 6.

In the upper end plate 2 there are disposed two further guide holes 7, 8 which, in the assembled state, guide two electrical terminal pins, the lower end of the electrical terminal pins passing through a clamp bearing 9.

Two spring elements 10, 11 or 12 are disposed on the inner lateral edges of the two guide holes 5, 6, a rigid stop 13, 14, 15 which is formed essentially centrally on and of a piece with a lateral edge of the guide hole 5 or 6 being located opposite the spring elements 10, 11, 12 in each case.

The spring elements 10, 11, 12 are made of plastic and are elongated, one of their ends being formed of a piece with a lateral edge of their respective guide hole 5 or 6 so that the spring elements 10, 11, 12 can rock elastically with their free end.

In the assembled state the spring elements 10-12 press against a piezo stack, which is inserted in the guide holes 5, 6, in the direction of their respective opposite rigid stops 13-15, so that the piezo stack assumes a defined position in the receiving sleeve 1 regardless of component tolerances of the piezo stack.

Figure 2B:
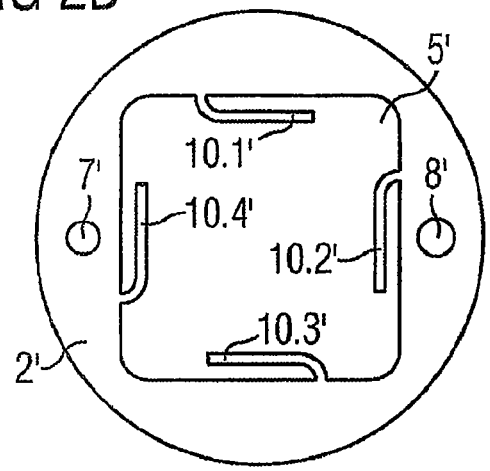

As the example of a receiving sleeve 1' according to the invention illustrated in FIGS. 2a and 2b largely coincides with the example illustrated in FIGS. 1a and 1b, to avoid repetitions reference is made to the above description and the same reference numerals will now be used to identify corresponding components, with only an apostrophe being added for differentiation.

A particular feature of this exemplary embodiment is that a spring element 10.1'-10.4', 12.1'-12.3' is formed on each lateral edge of the two guide holes 5', 6'. In the assembled state, in the region of the end plates 2', 3' of the receiving sleeve 1', the piezo stack is therefore enclosed by pairs of spring elements 10.1', 10.3' and 10.2', 10.4' disposed at right angles to one another which press against the piezo stack from outside, thereby centering it inside the receiving sleeve 1'.

Figure 3A:
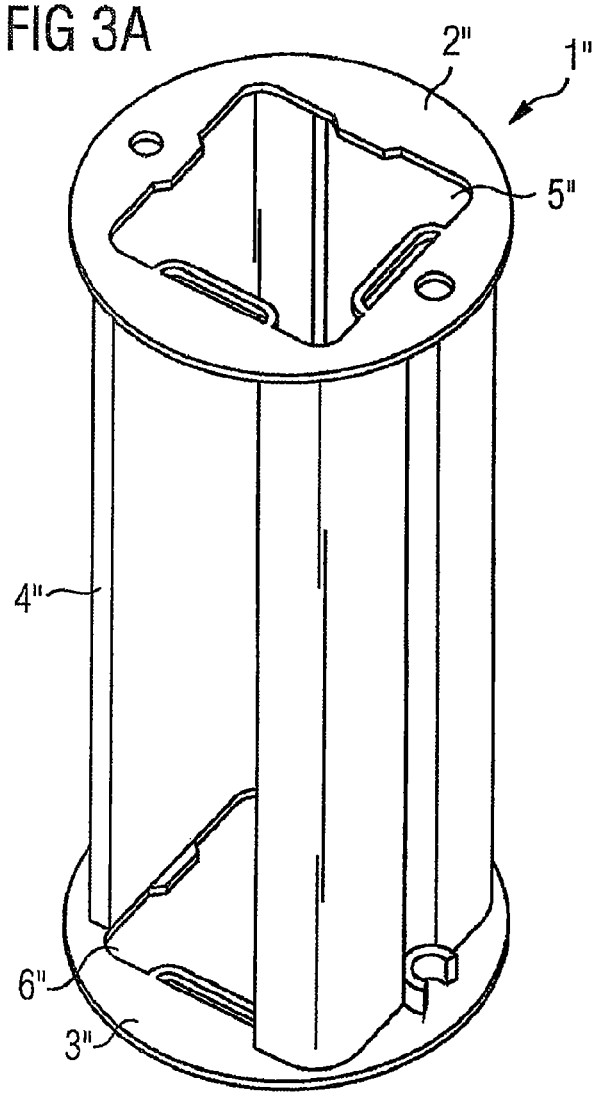
FIGS. 3a and 3b show another alternative embodiment of a receiving sleeve according to the invention.
Figure 3B:
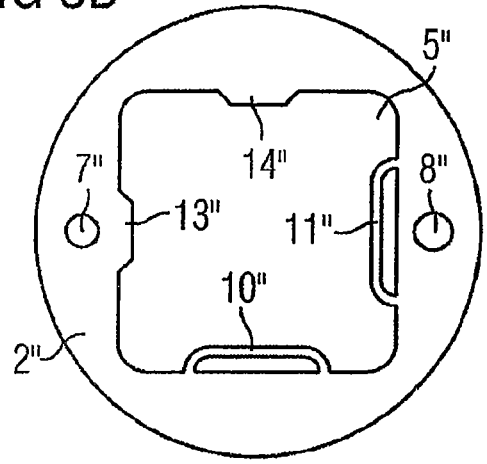

As the example of a receiving sleeve 1" according to the invention illustrated in FIGS. 3a and 3b largely coincides with the example illustrated in FIGS. 1a and 1b, to avoid repetitions reference is largely made to the above description and the same reference numerals will now be used to identify corresponding components, with only a double apostrophe being added for differentiation.

A particular feature of this exemplary embodiment is in the implementation of the spring elements 10", 11" which are elongated and are formed of a piece with the edge of the guide hole 5" and 6" respectively, so that the central region of the two spring elements 10", 11" presses resiliently against the piezo stack.

Figure 4A:
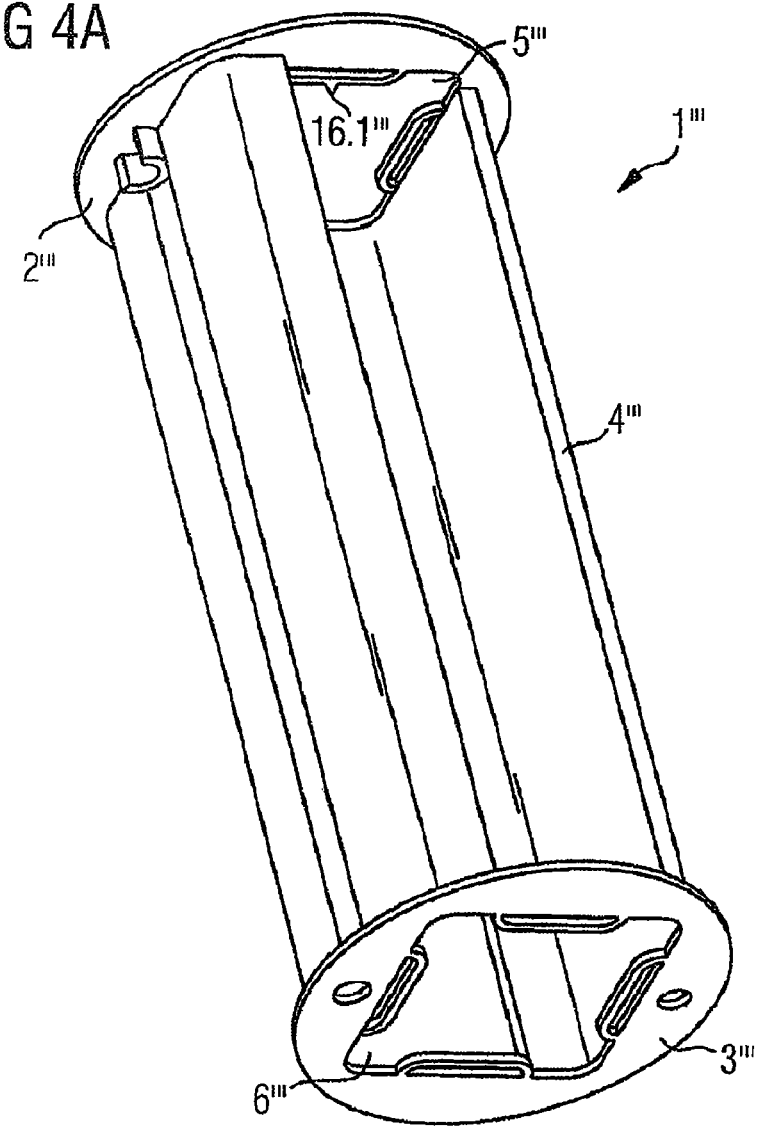
FIGS. 4a and 4b show a fourth example of such a receiving sleeve.
Figure 4B:
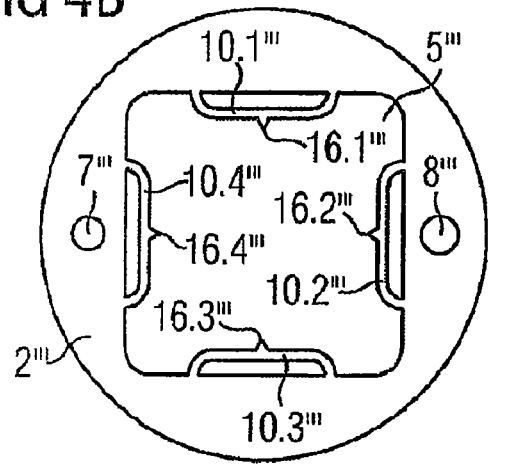

Finally, as the example of a receiving sleeve 1''' according to the invention illustrated in FIGS. 4a and 4b also largely coincides with the example illustrated in FIGS. 1a and 1b, to avoid repetitions reference is largely made to the above description and the same reference numerals will now be used to identify corresponding components, with only a triple apostrophe being added for differentiation.

A particular feature of the receiving sleeve 1''' is the design of the spring elements 10.1'''-10.4''' which are implemented in an elongated manner and are formed of a piece with a lateral edge of the guide hole 5''', 6''' at both ends so that the central region of the individual spring elements 10.1'''-10.4''' presses against the piezo stack from outside in an elastically resilient manner.

Another special feature is that on the individual spring elements 10.1''' there are centrally formed projecting lugs 16.1'''-16.4''' which, in the assembled state, are in punctiform contact with the piezo stack. In this way the friction between the piezo stack and the spring elements 10.1'''-10.4''' is reduced during the longitudinal expansion and contraction of the piezo stack occurring during operation.

Finally, a particular feature of the receiving sleeve 1''' is that the spring elements 10.1'''-10''' are beveled to facilitate the insertion of the piezo stack in the guide holes 5''' and 6'''.

The invention is not limited to the exemplary embodiments described above. On the contrary, a large number of variants and modifications are possible which likewise make use of the inventive concept and therefore fall within the scope of protection.

What is claimed is:

1. A receiving sleeve for an actuator body of a piezo actuator designed to expand and contract along a longitudinal direction to drive an injector of an injection system for an internal combustion engine, the receiving sleeve comprising at least two guide holes for supporting the actuator body and at least one spring element disposed on the at least two guide holes, the at least one spring element configured to apply lateral forces to the actuator body in at least one direction perpendicular to the longitudinal direction of the actuator body expansion and contraction to provide at least one of (a) a centering function for centering the actuator body laterally in the receiving sleeve and (b) a tolerance compensating function for compensating for lateral component tolerances of the actuator body in a lateral direction.

2. A receiving sleeve according to claim 1, wherein one or more spring elements are disposed on opposite sides of the actuator body, the spring elements pressing against the actuator body from outside in order to center the actuator body in the receiving sleeve.

3. A receiving sleeve according to claim 1, wherein the spring element is disposed on one side of the actuator body and presses unilaterally against the actuator body, while on the other side of the actuator body there is disposed a stop.

4. A receiving sleeve according to claim 1, wherein the two guide holes are essentially square and a spring element is disposed on each lateral edge of the two guide holes.

5. A receiving sleeve according to claim 1, wherein the two guide holes are essentially square, each guide hole having a spring element on two of its lateral edges and a stop on its other two lateral edges.

6. A receiving sleeve according to claim 5, wherein the two spring elements are disposed on the two guide holes on adjacent lateral edges in each case and the two stops are disposed on the two guide holes on adjacent lateral edges in each case.

7. A receiving sleeve according to claim 1, wherein the spring elements are formed of a piece with the receiving sleeve.

8. A receiving sleeve according to claim 7, wherein the spring elements are elongated, one of their ends being formed of a piece with the receiving sleeve, while the other end is free and presses elastically against the actuator body.

9. A receiving sleeve according to claim 7, wherein the spring elements are elongated and formed of a piece with the receiving sleeve at both of their ends, the central region of the spring elements pressing elastically against the actuator body.

10. A receiving sleeve according to claim 1, wherein the spring element is beveled to facilitate insertion of the actuator body.

11. A receiving sleeve according to claim 1, comprising an essentially punctiform or linear contact area between the spring element and the actuator body.

12. A receiving sleeve according to claim 11, wherein the linear contact area is oriented parallel to the longitudinal axis of the actuator body.

13. A receiving sleeve according to claim 11, wherein there is formed on the spring element a projecting lug which constitutes the punctiform or linear contact area with the actuator body.

14. A receiving sleeve according to claim 1, wherein the spring element is completely coatable with a potting compound apart from the contact with the actuator body.

15. A receiving sleeve according to claim 1, wherein there is a gap between the spring elements and the receiving sleeve sufficiently large to allow the penetration of a potting compound during encapsulation of the receiving sleeve.

16. A receiving sleeve according to claim 1, wherein the actuator body comprises a piezo stack.

17. An assembly comprising:
a piezo actuator having an actuator body extending in a longitudinal direction and configured to expand and contract along the longitudinal direction to drive an injector; and
a receiving sleeve for receiving the actuator body, the receiving sleeve including at least two guide holes for supporting the actuator body and at least one spring element disposed on the at least two guide holes, the at least one spring element configured to apply lateral forces to the actuator body in at least one direction perpendicular to the longitudinal direction of the actuator body expansion and contraction to provide at least one of (a) a centering function for centering the actuator body laterally in the receiving sleeve and (b) a tolerance compensating function for compensating for lateral component tolerances of the actuator body.

18. An injection system for an internal combustion engine, the injection system comprising:
an injector;
a piezo actuator having an actuator body extending in a longitudinal direction and configured to expand and contract along the longitudinal direction to drive the injector; and
a receiving sleeve for receiving the actuator body, the receiving sleeve including at least two guide holes for supporting the actuator body and at least one spring element disposed on the at least two guide holes, the at least one spring element configured to apply lateral forces to the actuator body in at least one direction perpendicular to the longitudinal direction of the actuator body expansion and contraction to provide at least one of (a) a centering function for centering the actuator body laterally in the receiving sleeve and (b) a tolerance compensating function for compensating for lateral component tolerances of the actuator body.

* * * * *